United States Patent [19]
Roberts

[11] Patent Number: 5,509,080
[45] Date of Patent: Apr. 16, 1996

[54] BASS CLIPPING CIRCUIT

[75] Inventor: John H. Roberts, Hickory, Miss.

[73] Assignee: Peavey Electronics Corporation, Meridian, Miss.

[21] Appl. No.: 208,898

[22] Filed: Mar. 14, 1994

[51] Int. Cl.[6] .............................. H03G 5/00; H04S 3/00
[52] U.S. Cl. .............................. 381/98; 333/28 T
[58] Field of Search ............................ 381/98, 101, 102, 381/55; 333/28 T; 330/294, 107, 109

[56] References Cited

U.S. PATENT DOCUMENTS

| | | | |
|---|---|---|---|
| 4,151,477 | 4/1979 | Yokoyama | 330/107 |
| 4,220,817 | 9/1980 | Kampmann | 330/109 |
| 4,490,843 | 12/1984 | Bose et al. | 381/102 |
| 4,891,841 | 1/1990 | Bohn | 381/98 |
| 4,982,435 | 1/1991 | Kato et al. | 381/102 |
| 5,138,665 | 8/1992 | Ito | 381/98 |
| 5,172,358 | 12/1992 | Kimura | 381/102 |

FOREIGN PATENT DOCUMENTS 0038703  3/1980  Japan ........................... 381/101

OTHER PUBLICATIONS

Radio Shack; *Linear Applications*; Nov. 1967 p. AN 31—13.

Primary Examiner—Edward L. Coles, Sr.
Assistant Examiner—Jerome Grant, II
Attorney, Agent, or Firm—Watson, Cole, Grindle & Watson

[57] ABSTRACT

A clipping circuit is coupled across the bass feedback shunt capacitor in an amplifier circuit to effectively reduce only high level bass signals while allowing level high frequencies to pass and allowing full boost to low level, low frequency signals.

10 Claims, 2 Drawing Sheets

BASS CLIPPING CIRCUIT

BACKGROUND OF THE INVENTION

The invention relates to audio amplifiers. In particular, the invention relates to an audio amplifier circuit for selectively clipping high amplitude, low frequency audio signals.

In audio amplifiers it is desirable to have good broad band response. It is also desirable to have the capability to adjust the high and low frequency response. This is typically achieved by means of so-called bass and treble controls or by equalizer circuits. In order to efficiently transfer signal to an output device, it is often necessary to provide amplifier circuits with an output transformer which represents an inductive impedance. The operating efficiency of an inductive impedance is adversely affected by a signal which has both a high amplitude and a low frequency. Efficient transfer of such signals demands an inductor or transformer which is much heavier than devices operating at higher frequencies and lower amplitudes. However, in order to obtain a satisfactory output signal for operating a speaker, for example, a good bass response is essential. There is thus a need for a circuit which has a reduced low frequency signal demand while maintaining full fidelity at a low signal levels.

SUMMARY OF THE INVENTION

The present invention is based upon the discovery that a clipping circuit across a bass feedback shunt capacitor in an amplifier circuit effectively reduces only the high level bass signal, while allowing high level, high frequency signals to pass and allowing full boost to low level, low frequency signals.

In a particular embodiment, the invention comprises an audio amplifier circuit for selectively clipping high amplitude, low frequency audio signals. An amplifier is provided which has an input, output and a feedback circuit therebetween. The feedback circuit includes a variable low frequency boost and cut resistance network for selectively boosting and cutting the low frequency resistance in the feedback circuit. A capacitive, impedance in shunt with the resistance, bypasses the low frequency resistance at high frequencies. A clipping circuit in shunt with the variable resistance clips the low frequency feedback above a selected level.

DESCRIPTION OF THE INVENTION

Figure 1:
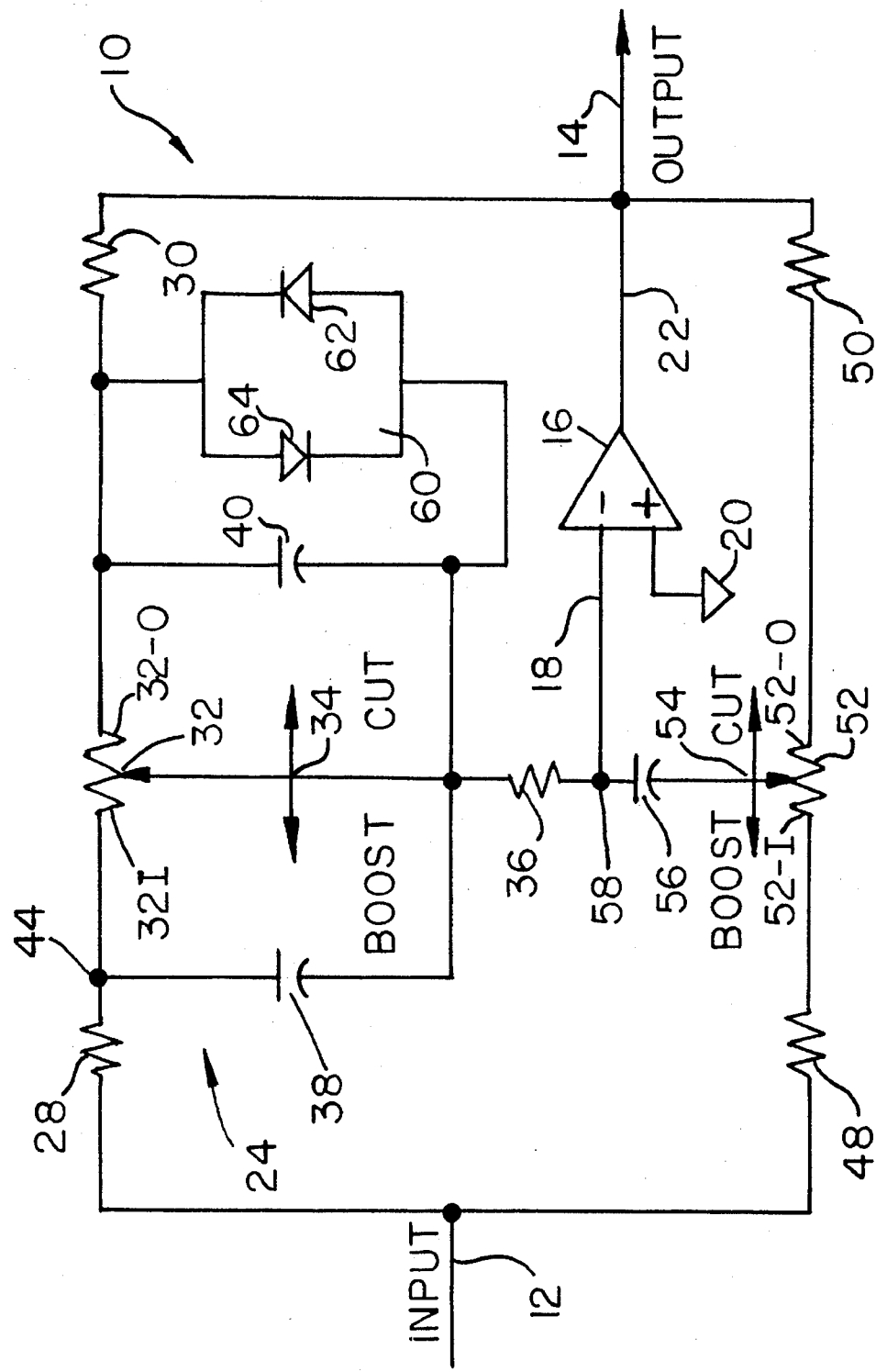
FIG. 1 is a schematic illustration of an audio amplifier having a tone control circuit with low frequency clipping according to the teachings of the present invention.

FIG. 1 illustrates an amplifier circuit 10 according to the present invention. The circuit has an input 12 and an output 14. Circuit 10 also includes an operational amplifier 16 which has an inverted input 18, a reference input 20 and an output 22 coupled to the output 14.

In the exemplary embodiment, two feedback circuits, namely a bass feedback network 24 and a treble feedback network 26 are employed. The bass feedback network 24 includes resistors 28 and 30 and potentiometer 32. The resistor 28 is coupled to the input 12, and the resistor 30 is coupled to the output 14. The potentiometer 32 is serially coupled between the resistors 28 and 30 and has a wiper 34 coupled via input resistor 36 to the inverted input 18 of the amplifier 16. It should be understood that depending on the position of the wiper 34 a portion of the resistance of the potentiometer 32 is in the input circuit. This portion is designated as 32-I. A portion of the resistance of the potentiometer 32 is in the output circuit and is designated 32-0. The capacitors 38 and 40 are commonly coupled to the node 42 between the wiper 34 and input resistor 36. Capacitor 38 is coupled to node 44 between the resistor and the potentiometer 32. Likewise, capacitor 40 is coupled to the node 46 between the output resistor 30 and the potentiometer 32.

The treble network 26 includes an input resistor 48, an output resistor 50 and a potentiometer 52. The input resistor 48 is coupled to the input 12, and the output resistor 50 is coupled to the output 14. The potentiometer 52 is serially coupled between the input and the output resistors 48 and 50. The potentiometer 52 has a wiper 54 which is coupled via an input capacitor 56 to the inverted input 18. The bass network 24 and the treble network 26 are commonly coupled at node 58 to the input of the operational amplifier 16, as shown.

In the bass feedback network 24, low frequency signals are coupled in feedback relation from the output 14 to the inverted input 18 of the amplifier 16 via the output resistor 30 and potentiometer 32 and input resistor 36, as shown. The wiper 34 is movable from left to right in the drawing. Movement to the right reduces the total feedback resistance and thus reduces the bass response by reducing that portion 32-0 of the resistance of the potentiometer 32 in the feedback circuit 24. Movement to the left increases the feedback resistance and thus increases the bass response of the operational amplifier 16. Capacitors 38 and 40 cause the potentiometer 32 to be shunted out of the circuit at high frequency.

The treble network 26 provides high frequency feedback through the output resistor 50, the potentiometer 52 and the input capacitor 56. Movement of the wiper 54 to the right decreases the feedback resistance, thereby reducing high frequency response. Likewise, movement of the wiper 54 to the left increases feedback resistance and thus increases the high frequency response. At low frequencies, the capacitor 56 is essentially an open circuit and the treble network is thereby rendered ineffective at such low frequencies.

In accordance with the invention, a clipping circuit 60 is provided in the output leg of the low frequency network 24. The clipping circuit 60 includes a pair of oppositely poled diodes 62 and 64. The wiring of the two opposing connected diodes 62 and 64 across the bass feedback shunt capacitor 40 effectively reduces only the high level bass signals while allowing full boost to low level, low frequency signals. This occurs because the diode 62 and 64 conduct at a selected voltage level established by the voltage drop across the diodes.

The diodes 62 and 64 do not hard limit the signal, but clamp the voltage developed across the feedback portion of the potentiometer 32. In accordance with the invention, the gain of the operational amplifier 16 at low level, low frequency signals may be described as $R_{30}+R_{32-O}/R_{28}+R_{32-I}$. As the low frequency signal increases above the limit established by the diode, the gain becomes $R_{30}/R_{28}+R_{32-I}$. Thus, the gain is reduced by effectively eliminating a portion of the feedback resistance $R_{32-O}$ in the base network 24. The gain reduction is effectively a soft limiting effect which provides significant reductions in low frequency signal demands while maintaining full fidelity at low signal levels. In other words, the low frequency signal is sensed but at a lower amplitude level. If the output of output 14 of the circuit 10 is coupled to a transformer, the transformer demands are substantially reduced.

Figure 2:
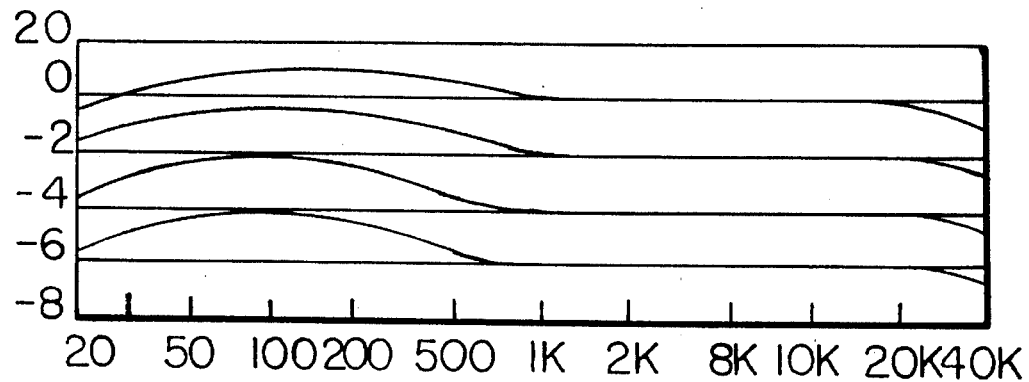
FIG. 2 is a frequency plot of output responses of the circuit of FIG. 1 at various amplitudes when set for maximum boost.

FIG. 2 illustrates a frequency response diagram of the circuit of FIG. 1 at various output levels with potentiometer 32 set for boost. It can be appreciated that at low frequencies, the base response is significantly boosted. However, as the output signal increases, the amplitude level is softened by the clipping action of the oppositely poled diodes 62 and 64.

Figure 3:
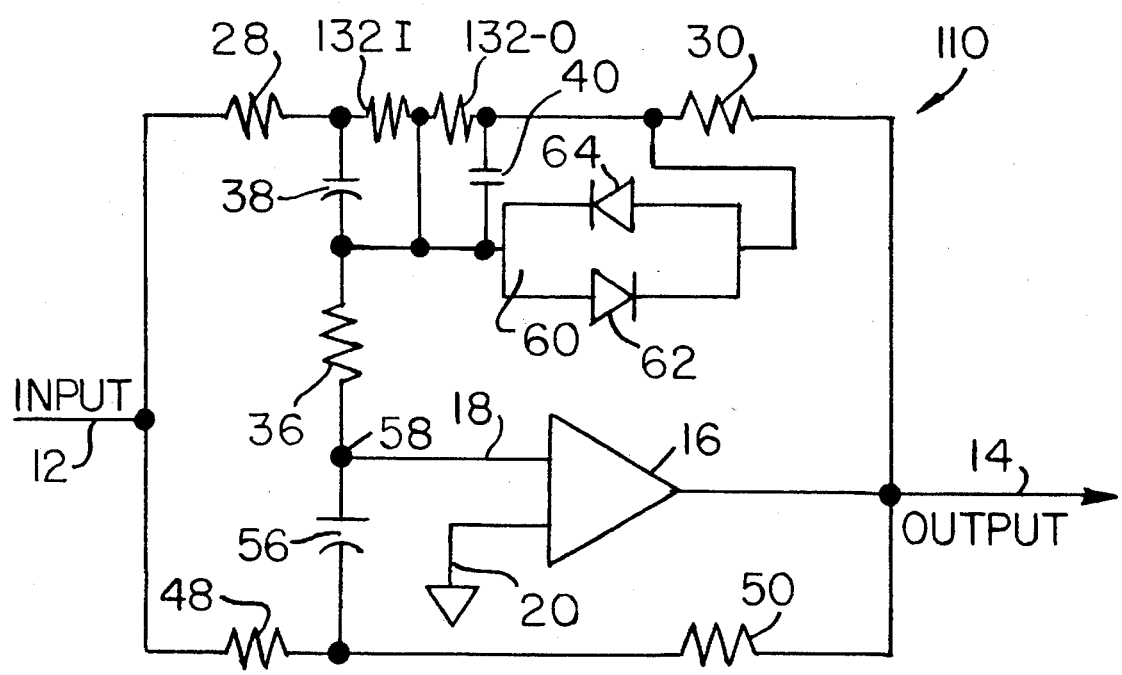
FIG. 3 is an alternative embodiment of the invention which does not employ a variable boost and cut circuit.

FIG. 3 illustrates an alternative embodiment of an audio amplifier 110 according to the invention, wherein the same reference numerals are used for the corresponding elements of FIG. 1. In the arrangement of FIG. 3, the bass feedback circuit 124 and the treble feedback circuit have been modified to eliminate the boost and cut features. In such an arrangement, the potentiometer 32 has been eliminated from the bass feedback circuit 124 and the fixed resistors 132-I and 132-O have been substituted therefor. The potentiometer 52 has been eliminated in the treble feedback circuit 126. The circuit 110 has no variable boost and cut feature, but has a generally flat response except for the boost provided by the clipping circuit 60 at low frequency. In FIG. 3, the gain of the system is defined as $R_{30}/R_{28}$ until the diodes 62 and 64 clamp, that is, until the feedback signal exceeds the voltage drop across the diodes. At high frequency, the gain is defined as $R_{50}/R_{48}$ which is the feedback ratio in the treble feedback circuit 126.

While there have been described what are at present considered to be the preferred embodiments of the present invention, it will be apparent to those skilled in the art that various changes and modifications may be made therein without departing from the invention, and it is intended in the appended claims to cover such changes and modifications as fall within the spirit and scope of the invention.

What is claimed is:

1. An audio amplifier circuit for selectively clipping high amplitude, low frequency audio signals comprising: an amplifier having an input circuit and an output circuit and a feedback circuit coupled therebetween, the feedback circuit including a variable low frequency boost and cut resistance network having a variable low frequency resistance for selectively boosting and cutting said low frequency resistance in the feedback circuit, an impedance in shunt with the low frequency resistance for bypassing the low frequency resistance at high frequencies, and clipping means in shunt with the low frequency resistance for clipping the feedback above a selected level.

2. The audio amplifier of claim 1 further including a variable high frequency boost and cut resistance having a variable high frequency resistance for selectively boosting and cutting said high frequency resistance in the feedback circuit.

3. The audio amplifier of claim 1 wherein the clipping means includes a bidirectional circuit for clipping positive and negative signals above the selected level.

4. The audio amplifier of claim 1 wherein the clipping means includes a pair of oppositely poled parallel connected diodes.

5. The audio amplifier of claim 1 further including a fixed resistor in series with the variable low frequency resistance.

6. The audio amplifier of claim 1 wherein the feedback circuit further includes a variable high frequency boost and cut resistance network having a variable high frequency resistance for selectively boosting and cutting said high frequency resistance in the feedback circuit.

7. An audio amplifier of claim 6 further including an impedance in series with the high frequency resistance for open circuiting the high frequency resistance at low frequencies.

8. An audio amplifier circuit for selectively clipping high amplitude, low frequency audio signals comprising: an amplifier having an input circuit and an output circuit and a feedback circuit coupled therebetween, the feedback circuit including a variable low frequency network for selectively boosting and cutting the low frequency response in the feedback circuit, an impedance and shunt with the resistance for bypassing the low frequency network at high frequencies, and clipping means in shunt with the variable network for clipping the feedback above a selected level.

9. An audio amplifier circuit for selectively clipping high amplitude, low frequency audio signals comprising: an amplifier responsive to the audio signals having an input and an output and a low frequency responsive feedback circuit coupled therebetween for providing low frequency boost to the audio signals, the feedback circuit including a feedback resistance coupled between the input and the output, and clipping means in shunt with at least a portion of the feedback resistance for clipping the feedback above a selected level for limiting the low frequency boost to said audio signals.

10. An audio amplifier circuit for selectively clipping high amplitude, low frequency audio signals comprising: an amplifier having an input circuit and an output circuit and a feedback circuit coupled therebetween, the feedback circuit including a low frequency network being selectively responsive to low frequency signals in the feedback circuit and a high frequency network being selectively responsive to high frequency signals in the feedback circuit, and clipping means in shunt with the low frequency network for clipping the low frequency signals in the feedback circuit above a selected level.

* * * * *